(12) United States Patent
Higashi et al.

(10) Patent No.: US 7,652,351 B2
(45) Date of Patent: Jan. 26, 2010

(54) SEMICONDUCTOR DEVICE AND METHOD OF MANUFACTURING THE SAME

(75) Inventors: Kazuyuki Higashi, Yokohama (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 637 days.

(21) Appl. No.: 11/117,726

(22) Filed: Apr. 29, 2005

(65) Prior Publication Data

US 2005/0285229 A1    Dec. 29, 2005

(30) Foreign Application Priority Data

Jun. 28, 2004    (JP)    ............................. 2004-189929

(51) Int. Cl.
*H01L 23/58*    (2006.01)
(52) U.S. Cl. .................. 257/594; 257/527; 257/618; 257/750; 257/E23.142
(58) Field of Classification Search ................. 257/594, 257/618, 620, 750, 758, 527, 622
See application file for complete search history.

(56) References Cited

U.S. PATENT DOCUMENTS

| | | | | |
|---|---|---|---|---|
| 5,451,801 A | * | 9/1995 | Anderson et al. | 257/202 |
| 6,022,791 A | * | 2/2000 | Cook et al. | 438/458 |
| 6,424,051 B1 | | 7/2002 | Shinogi et al. | |
| 6,879,019 B2 | * | 4/2005 | Windlass et al. | 257/529 |

* cited by examiner

*Primary Examiner*—Wai-Sing Louie
(74) *Attorney, Agent, or Firm*—Foley & Lardner LLP (57) ABSTRACT

A semiconductor device according to an embodiment of the present invention includes a plurality of chip regions and a plurality of chip rings. The plurality of chip regions include semiconductor integrated circuits each having a multilayered wiring structure using a metal wiring, and are formed into independent chips. The plurality of chip rings has the multilayered wiring structure using the metal wiring, and surround the respective chip regions. The plurality of chip rings are electrically connected to one another.

12 Claims, 9 Drawing Sheets

Arrows : current path

FIG. 4

∧∧∧ : Dicing line

Arrows : current path

FIG. 11

∧∧∧ : Dicing line

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-189929, filed Jun. 28, 2004, the entire contents of which are incorporated herein by reference.

BACKGROUND OF THE INVENTION

1. Field of the Invention

The present invention relates to semiconductor devices such as a logical large-scale integrated circuit (logic LSI), a memory LSI represented by a dynamic random access memory (DRAM) and a static random access memory (SRAM), and an LSI constituted of a bipolar transistor.

2. Description of the Related Art

In recent years, wirings have been miniaturized and multilayered, and accordingly copper (Cu) has been frequently used as a wiring material for a purpose of lowering resistance of a wiring layer. As a method of forming a copper wiring, an electrolytic plating process which is advantageous in forming fine patterns has been usually used.

Figure 1:
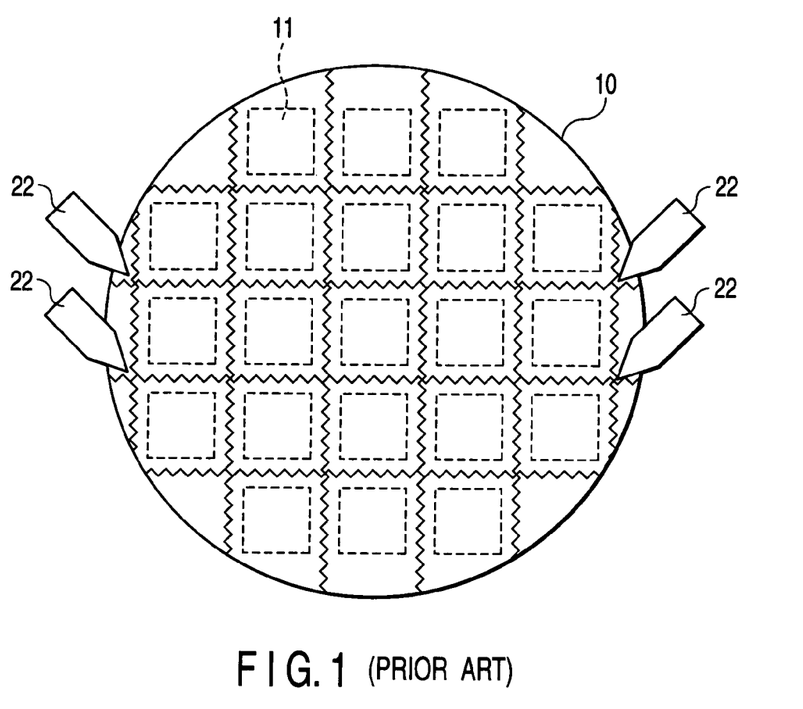
FIG. 1 is a plan view showing a conventional semiconductor device.

In the electrolytic plating process, for example, as shown in FIG. 1, a method is adopted in which a current is supplied to a plurality of inner chip regions 11 from terminals 22 contacting a peripheral portion of a wafer 10, and copper is deposited on seed-Cu which is a seed layer constituting a seed in forming a film of copper. Since seed-Cu also functions as a current supply path at the time of plating, the film is formed on the whole surface of the wafer by a sputtering process before the plating.

Figure 2:
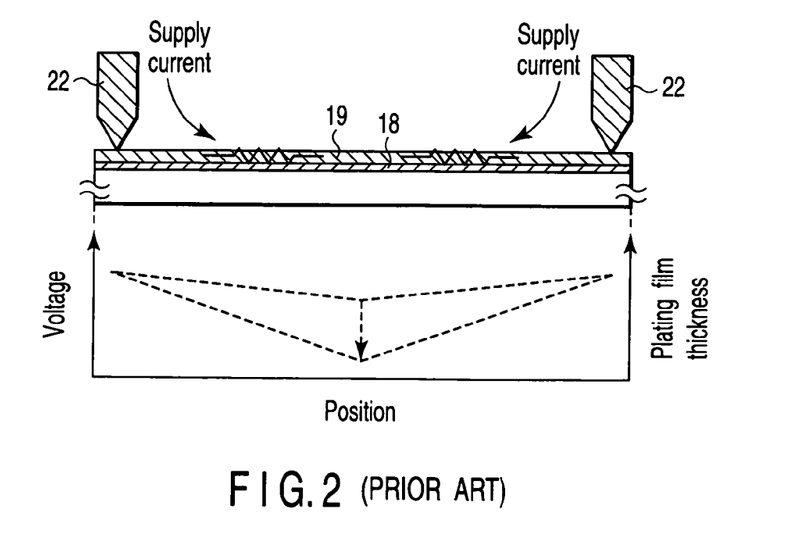
FIG. 2 is a diagram showing a condition at the time of copper plating.

However, in recent years, the miniaturization of the wiring has further proceeded, and seed-Cu itself has been thinned in a very small thickness of 50 nm or less. Therefore, as shown in FIG. 2, a resistance value of seed-Cu 19 on a barrier metal 18 increases, and a voltage drop amount is large in a wafer middle portion as compared with the peripheral portion of the wafer. As a result, a fluctuation in the thickness (plating film thickness) of copper deposited on seed-Cu 19 also increases.

Additionally, as techniques for suppressing the fluctuation of the thickness of copper deposited on seed-Cu, a method in which a current supply source is newly disposed in the wafer middle portion, a method in which a resistance distribution of a plating solution is controlled in a wafer surface and the like have been proposed.

However, in the former method, dust is generated on the wafer, and in the latter method, the plating solution or a plating device has to be remodeled.

BRIEF SUMMARY OF THE INVENTION

According to an aspect of the present invention, there is provided a semiconductor device comprising: a plurality of chip regions in which semiconductor integrated circuits each having a multilayered wiring structure using a metal wiring are formed and which become independent chips; and a plurality of chip rings each having the multilayered wiring structure using the metal wiring and surrounding the respective chip regions, wherein the plurality of chip rings are electrically connected to one another.

DETAILED DESCRIPTION OF THE INVENTION

An aspect of the present invention will be described below in detail with reference to the accompanying drawing.

1. Outline

When a current for metal plating is supplied from a wafer peripheral portion, a voltage drop amount in a wafer middle portion may be reduced in order to improve uniformity in a wafer surface having a plating film thickness. However, a problem has occurred that dust is generated or that a plating solution and a plating device are remodeled in a method in which a new current supply source is disposed in the wafer middle portion or a resistance distribution of the plating solution is controlled in the wafer surface.

To solve the problem, in an embodiment of the present invention, in order to reduce the voltage drop amount in the wafer middle portion and to improve the uniformity in the wafer surface having the plating film thickness, in addition to a thin seed layer constituting a substrate of the metal plating, a chip ring (also referred to as a guard ring, or a via ring) usually disposed around a chip (device) region is used.

Since the chip ring is usually disposed for a purpose of protecting the chip region from damages at the time of dicing, the chip ring is structured to have a ring shape surrounding the chip region with a metal. However, since the purpose of the chip ring consistently lies in protection of the chip region, the chip ring closes as one ring as indicated by its name, and a plurality of chip rings are not electrically connected to one another.

On the other hand, in the embodiment of the present invention, since a new purpose of imparting a function of a current supply path at the time of plating to the chip ring is added, a plurality of chip rings are structured to be electrically connected to one another.

According to the structure, even if a seed layer is thinned, a current necessary for the metal plating is uniformly supplied to a plurality of chip regions via the chip rings extended in a wafer from the periphery of the wafer. Therefore, a plating layer having a uniform thickness can be formed in a wafer surface regardless of the thickness of the seed layer.

It is to be noted that in the embodiment of the present invention, a purpose of improving uniformity of the plating film thickness in the wafer surface is realized by a device structure. That is, when a part of a pattern of a mask for use in forming a multilayered wiring is simply changed, the original purpose can be realized. When a part of the pattern is changed in this manner without remodeling a plating solution or a plating device, the structure can contribute to improvement of a process capability of an LSI.

2. EMBODIMENT

Embodiments considered as best will be described below.

(1) First Embodiment

Figure 3:
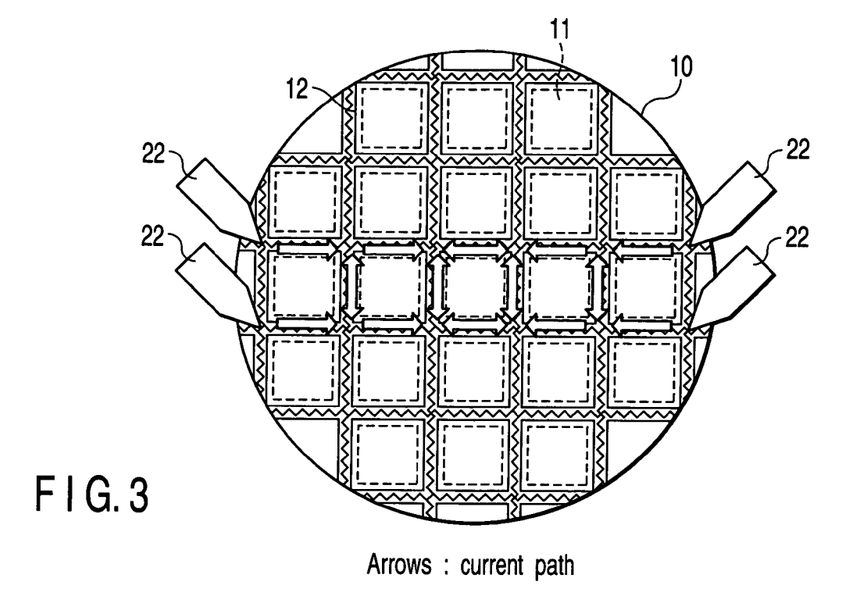
FIG. 3 is a plan view showing a semiconductor device according to a first embodiment.
Figure 4:
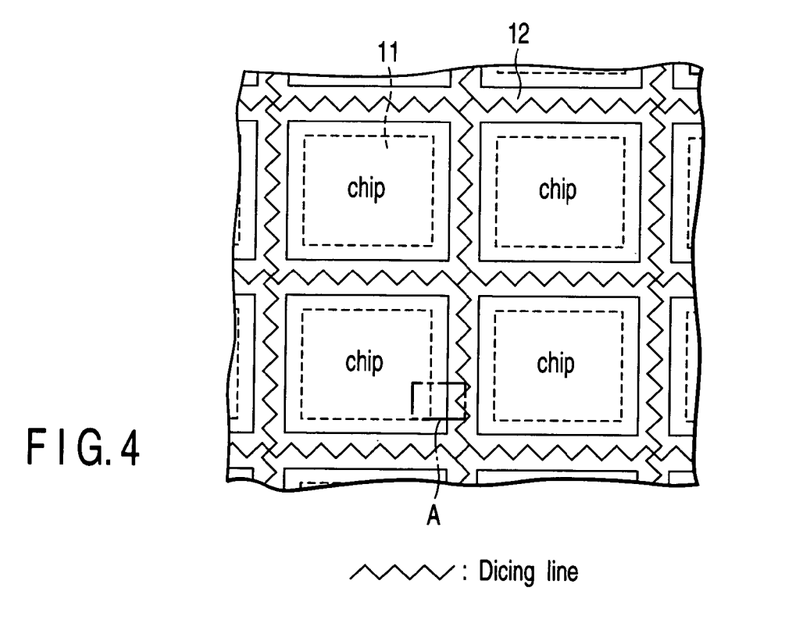
FIG. 4 is an enlarged view of a part of FIG. 3.

FIG. 3 shows an outline of a semiconductor device according to a first embodiment. FIG. 4 is an enlarged view of a part of FIG. 3.

These figures show a positional relation among a plurality of chip (device) regions 11 on a wafer 10, chip rings 12 extended on the wafer 10, and dicing lines (shown by zigzag lines) which are regions for separating the plurality of chip regions 11.

In the present embodiment, the chip rings 12 are electrically connected to one another, and laid out in a lattice shape as a whole on the wafer 10. The chip regions 11 are disposed among lattices of the latticed chip rings 12.

Terminals 22 for supplying a current at the time of plating contact only a peripheral portion of the wafer 10, but the current uniformly spreads in all the chip regions 11 via the chip rings 12 extended in the lattice shape on the wafer 10.

According to the constitution, instead of seed copper having a high resistance which is a seed layer constituting a substrate of copper plating, the current can be supplied to the vicinities of all the chip regions mainly using the chip rings having a low resistance. Therefore, a voltage drop amount in a wafer middle portion drops, and the copper plating can be uniformly formed in a wafer surface regardless of a thickness of seed copper.

Figure 5:
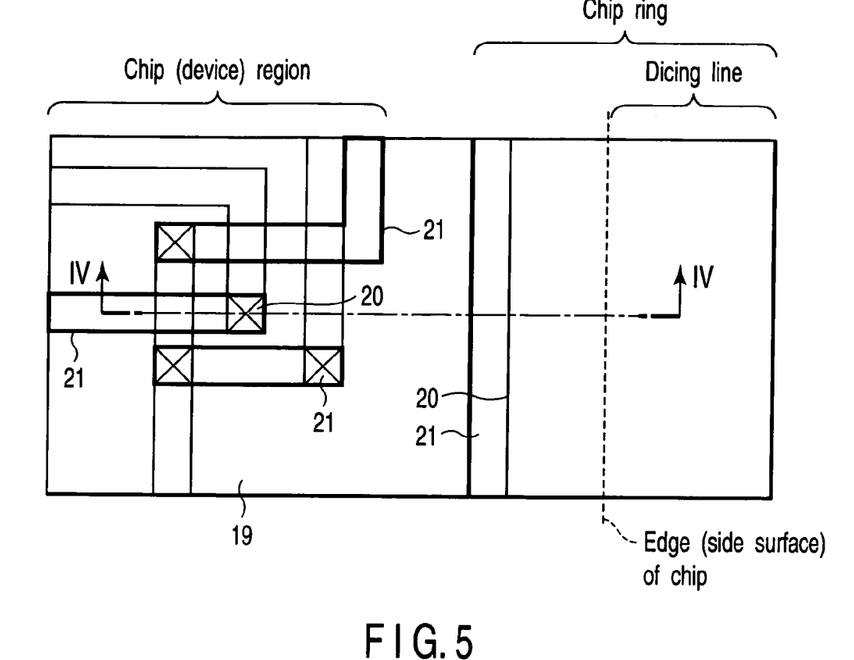
FIG. 5 is a plan view showing region A of FIG. 4.
Figure 6:
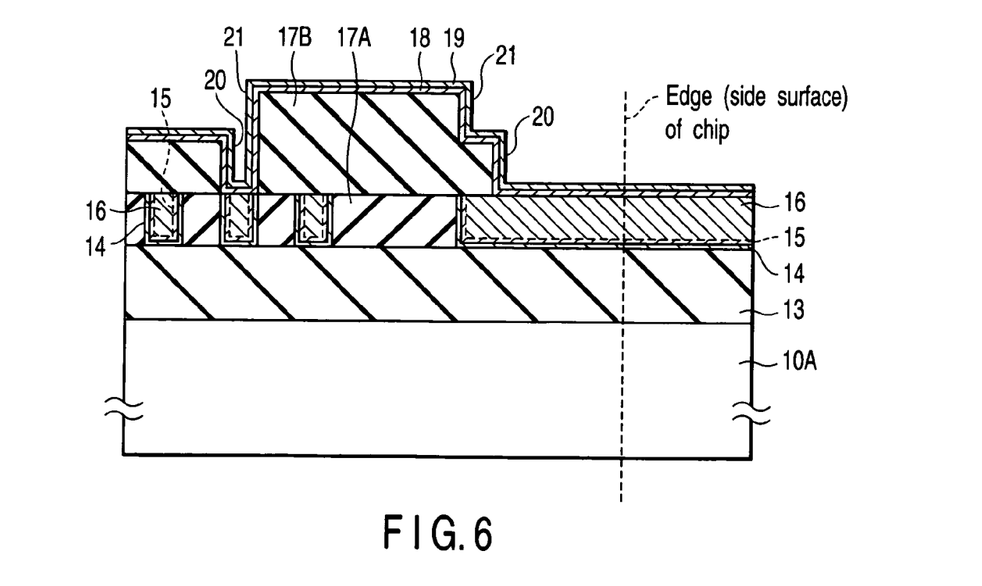
FIG. 6 is a sectional view taken along line VI-VI of FIG. 5.

FIG. 5 shows region A of FIG. 4. FIG. 6 is a sectional view taken along line VI-VI of FIG. 5.

A large-scale integrated circuit (LSI) having a multilayered wiring structure is formed in the chip (device) region. The chip ring is formed around the chip region, and has a multilayered wiring structure in the same manner as in the wiring in the chip region. The dicing line overlaps with the chip ring, and a width of the dicing line becomes smaller than that of the chip ring.

In this structure, since the chip ring itself is cut along the chip ring at the time of dicing, the chip ring is exposed entirely to an edge (side surface) of the chip cut out by the dicing.

The device structure of FIG. 6 shows a state before copper plating is performed.

An underlayer wiring is constituted of a barrier metal 14 and a copper layer 16. It is to be noted that reference numeral 15 denotes seed copper constituting a substrate in forming the copper layer 16 by an electrolytic plating process.

Concave portions (wiring trench, contact hole, etc.) 20, 21 are formed in an insulation layer 17B. A barrier metal 18 and seed copper 19 are formed by a sputtering process in such a manner as to coat the surface of the insulation layer 17B and all the concave portions.

Figure 7:
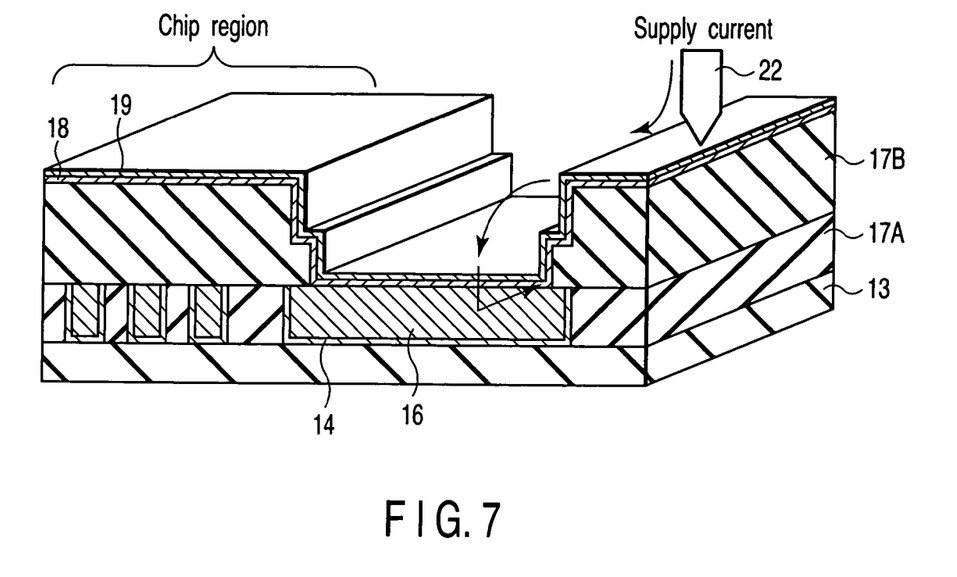
FIG. 7 is a diagram showing a condition at the time of the copper plating.
Figure 8:
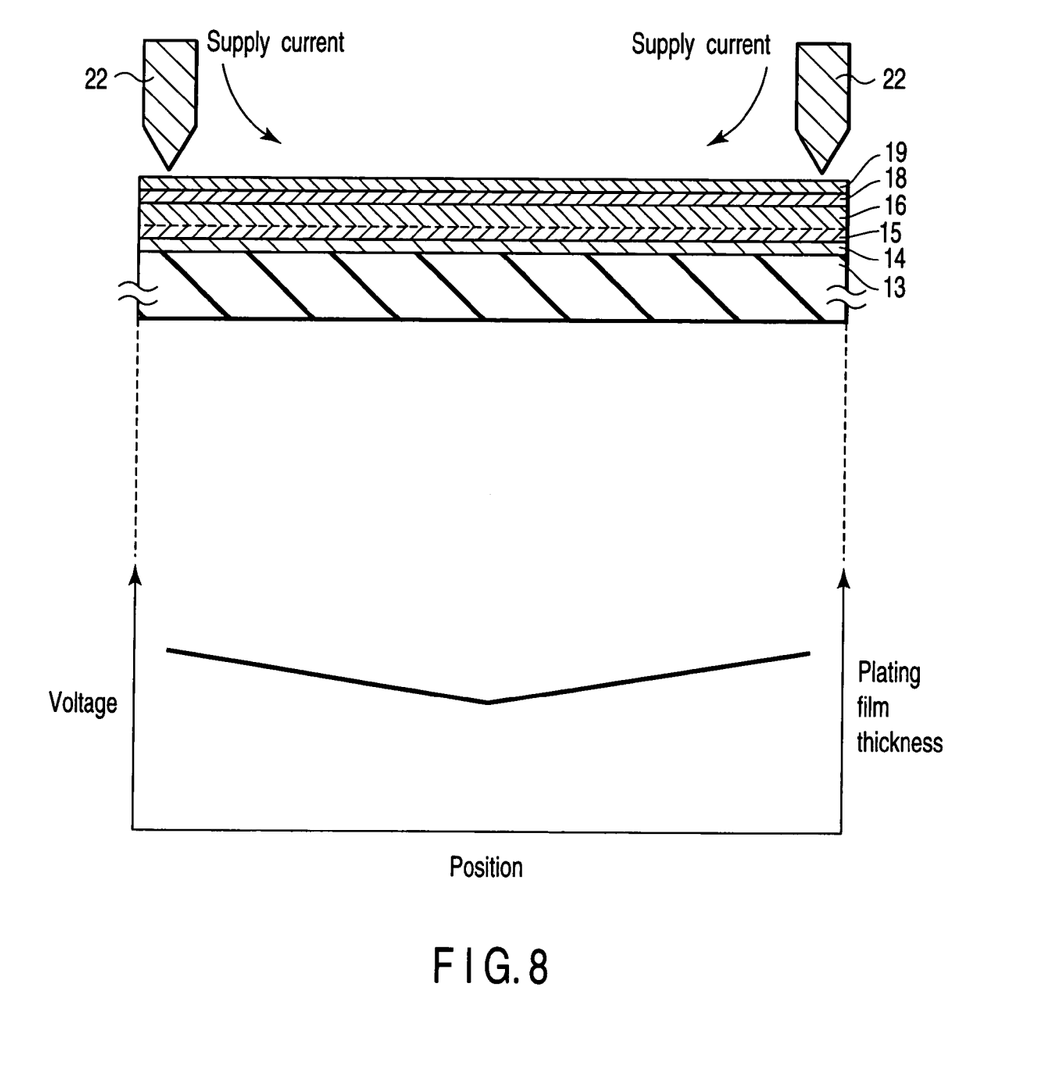
FIG. 8 is a diagram showing a condition at the time of the copper plating.

Thereafter, a copper layer is deposited on seed copper 19 by the electrolytic plating process, but at this time, for example, as shown in FIGS. 7 and 8, a current is supplied to the vicinities of all the chip regions on the wafer via the low-resistance chip ring, that is, the copper layer 16. Therefore, the voltage drop amount in the middle portion of the wafer decreases.

Figure 9:
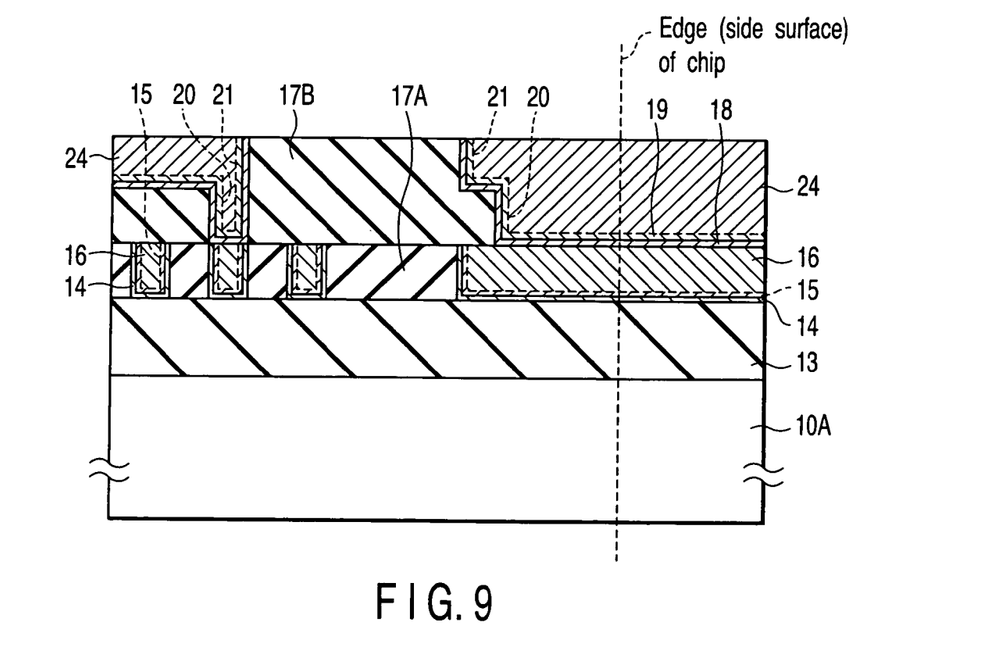
FIG. 9 is a diagram showing a condition after end of the copper plating.

Therefore, as shown in FIG. 9, when a copper layer 24 is formed by the electrolytic plating process, the copper layer 24 is formed in a uniform thickness on the wafer substantially regardless of a position on the wafer. Thereafter, for example, the copper layer 24 is polished by a CMP process, and the copper layer 24 is left only in the concave portions 20, 21 of the insulation layer 17B.

It is to be noted that the barrier metal and seed copper can also be formed, for example, by a chemical vapor deposition (CVD) process, an atomic layer deposition (ALD) process or the like in addition to the sputtering process.

Thus, according to the present embodiment, when the pattern of the chip ring is formed into the lattice shape, the current can be uniformly supplied to the plurality of chip regions from the peripheral portion of the wafer via the chip rings at the time of the copper plating, and therefore uniformity of the plating film in the wafer surface can be improved.

(2) Second Embodiment

Figure 10:
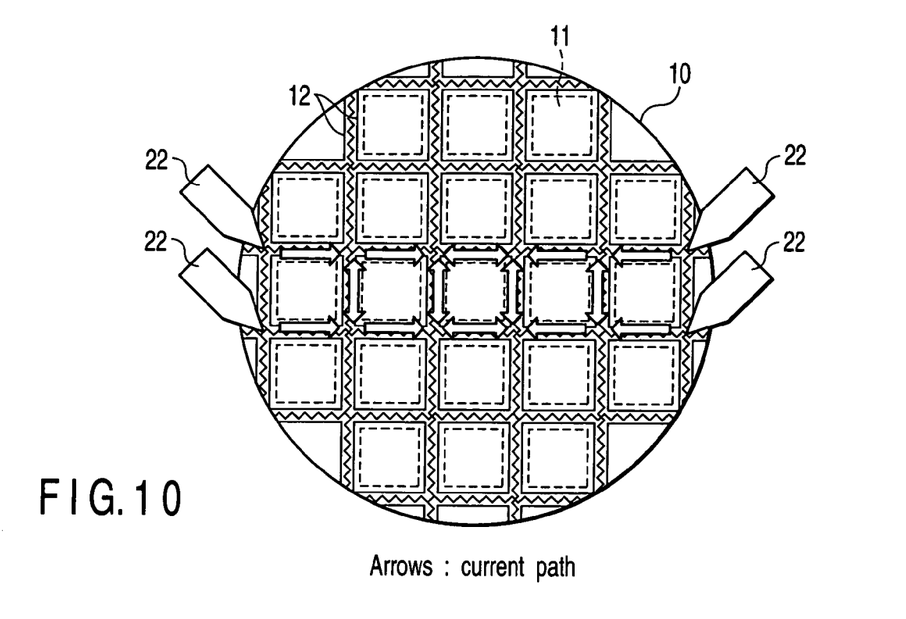
FIG. 10 is a plan view showing a semiconductor device according to a second embodiment.
Figure 11:
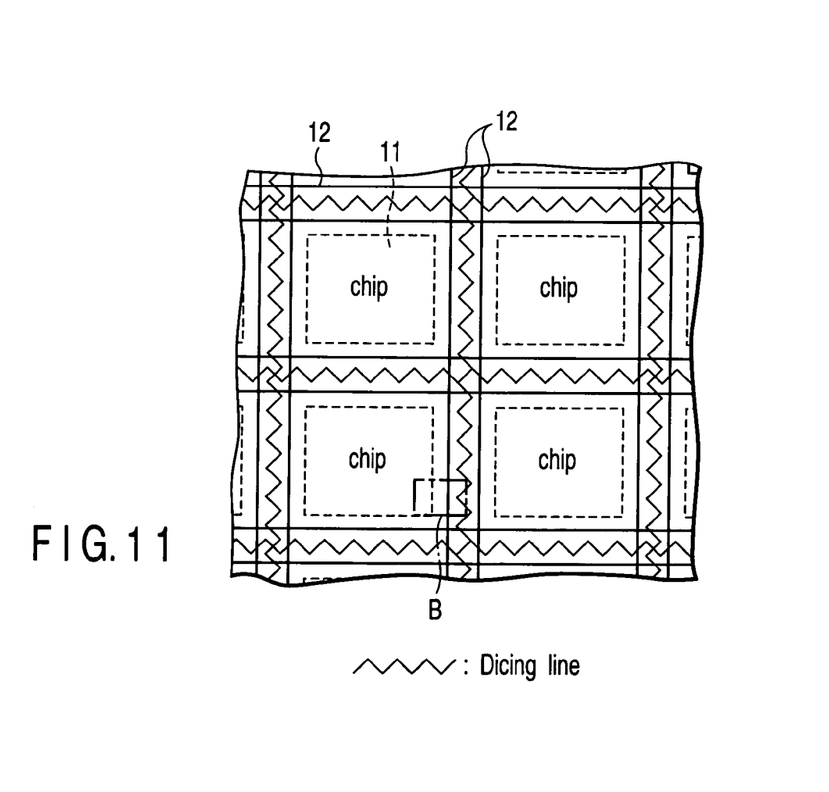
FIG. 11 is an enlarged view of a part of FIG. 10.

FIG. 10 shows an outline of a semiconductor device according to a second embodiment. FIG. 11 is an enlarged view of a part of FIG. 10.

The present embodiment relates to an improvement in which the device structure according to the first embodiment is improved for a purpose of reducing a region where a chip ring overlaps with a dicing line to the utmost. In the present embodiment, there is proposed a structure capable of setting the region where the chip rings overlap with the dicing lines to be less than 10% of a total region where the chip rings are formed.

Chip rings 12 are laid out in a lattice shape on a wafer 10 as a whole in the same manner as in the first embodiment. Chip regions 11 are disposed among lattices of the latticed chip rings 12. Additionally, since the chip rings 12 are arranged avoiding the dicing lines, each chip ring is structured to surround the chip region 11 inside the dicing line.

Therefore, the chip rings 12 overlap with the dicing lines only in corner portions of chip regions which electrically connect the chip rings 12 to one another.

Here, terminals 22 for supplying the current at the time of plating contact only the peripheral portion of the wafer 10, but the current uniformly spreads over all the chip regions 11 via the chip rings 12 extended in the lattice shape on the wafer 10.

According to the constitution, instead of seed copper having a high resistance, the current can be supplied to the vicinities of all the chip regions mainly using the chip rings having a low resistance. Therefore, a voltage drop amount in a wafer middle portion drops, and the copper plating can be uniformly formed in a wafer surface regardless of a thickness of seed copper.

Moreover, since the chip rings are arranged avoiding the dicing lines, copper at the time of dicing can be inhibited from being flied/scattered, and contamination of LSI chips can be avoided.

Figure 12:
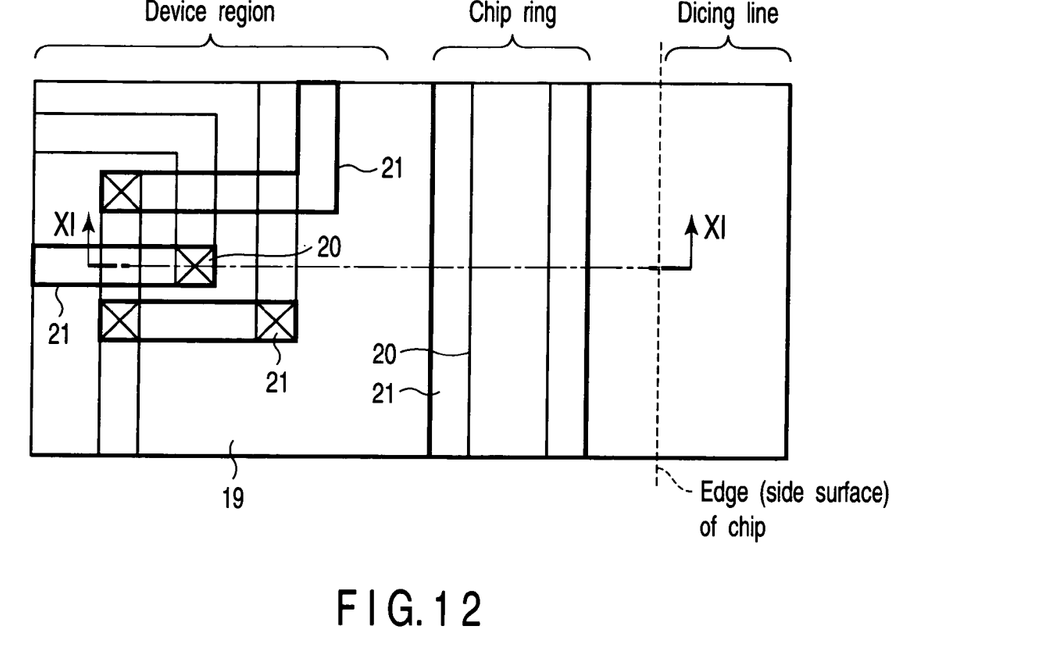
FIG. 12 is a plan view showing region B of FIG. 11.
Figure 13:
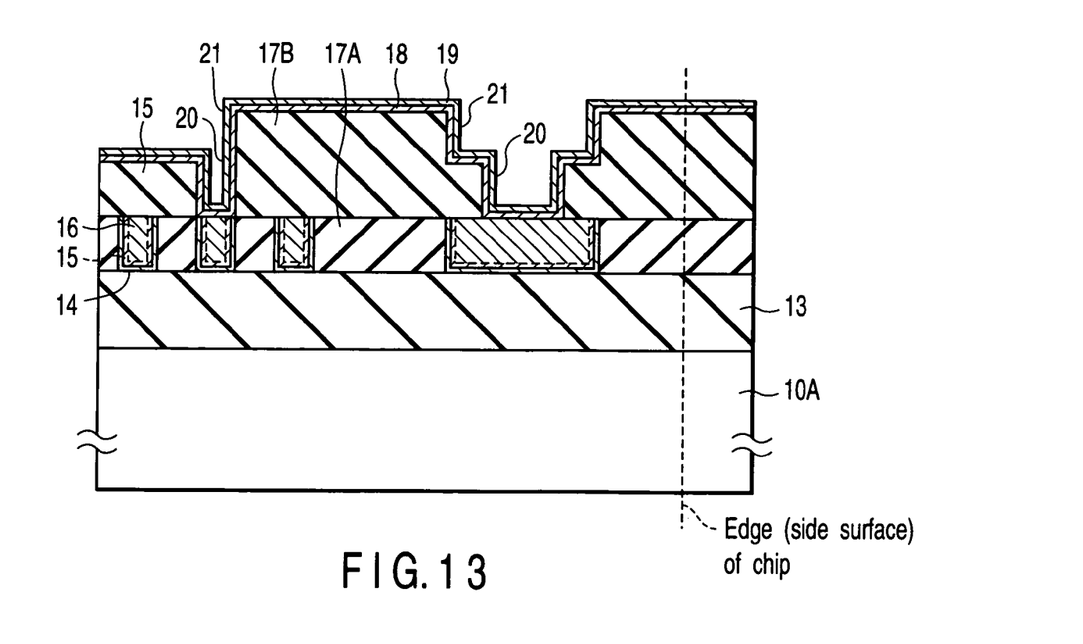
FIG. 13 is a sectional view taken along XIII-XIII line of FIG. 12.

FIG. 12 shows region B of FIG. 11. FIG. 13 is a sectional view taken along XIII-XIII line of FIG. 12.

In the chip (device) region, a large-scale integrated circuit (LSI) having a multilayered wiring structure is formed. The chip ring is formed around the chip region, and has a multilayered wiring structure in the same manner as in the wiring in the chip region. Since the chip rings are arranged avoiding the dicing lines, the chip rings are structured to surround the chip regions inside the dicing lines.

In this structure, since the dicing is performed avoiding the chip rings, the whole chip ring is not exposed to the edge (side surface) of the chip cut out by the dicing. Additionally, as described later, a part of the chip ring is partially exposed to each corner portion of the chip having a rectangular shape.

The device structure of FIG. 13 shows a state before copper plating is performed.

An underlayer wiring is constituted of a barrier metal 14 and a copper layer 16. It is to be noted that reference numeral 15 denotes seed copper constituting a substrate in forming the copper layer 16 by an electrolytic plating process.

Concave portions (wiring trench, contact hole, etc.) 20, 21 are formed in an insulation layer 17B. A barrier metal 18 and seed copper 19 are formed by a sputtering process in such a manner as to coat the surface of the insulation layer 17B and all the concave portions.

Figure 14:
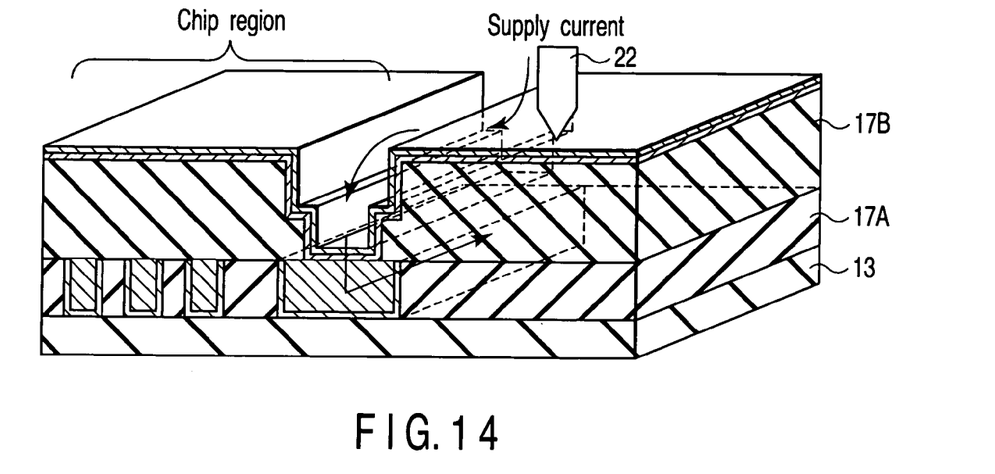
FIG. 14 is a diagram showing a condition at the time of the copper plating.

Thereafter, a copper layer is deposited on seed copper 19 by the electrolytic plating process, but at this time, for example, as shown in FIG. 14, a current is supplied to the vicinities of all the chip regions on the wafer via the chip ring having a low resistance, that is, the copper layer 16. Therefore, the voltage drop amount in the middle portion of the wafer decreases.

Figure 15:
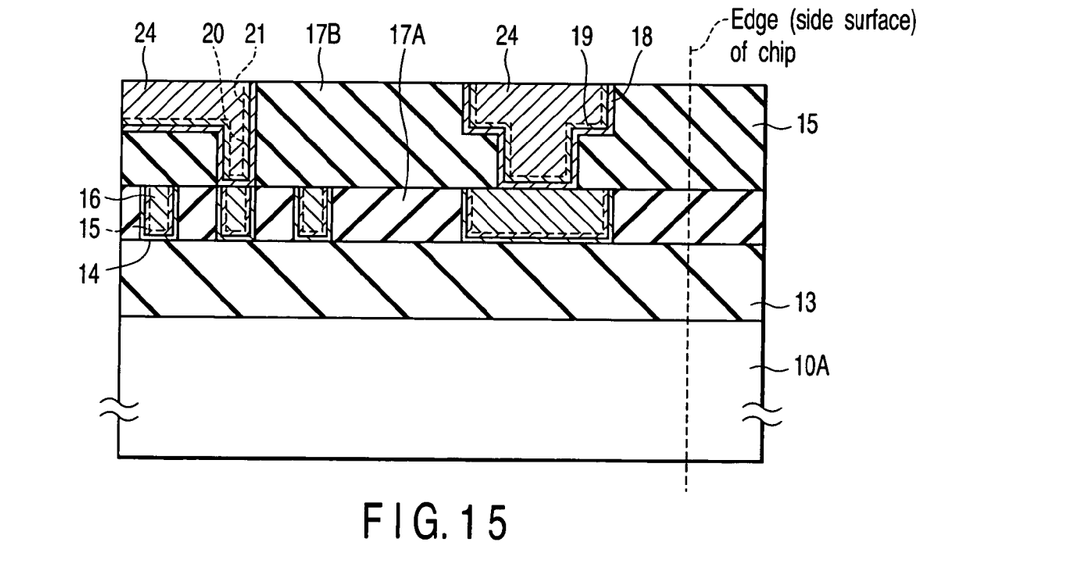
FIG. 15 is a diagram showing a condition after the end of the copper plating.

Therefore, as shown in FIG. 15, when a copper layer 24 is formed by the electrolytic plating process, the copper layer 24 is formed in a uniform thickness on the wafer substantially regardless of a position on the wafer. Thereafter, for example, the copper layer 24 is polished by a CMP process, and the copper layer 24 is left only in the concave portions 20, 21 of the insulation layer 17B.

It is to be noted that the barrier metal and seed copper can also be formed not only by the sputtering process but also, for example, by a CVD process, an ALD process or the like.

Thus, even in the present embodiment, when the pattern of the chip ring is formed into the lattice shape, the current can be uniformly supplied to the plurality of chip regions from the peripheral portion of the wafer via the chip rings at the time of the copper plating, and therefore uniformity of the plating film in the wafer surface can be improved.

Additionally, in the present embodiment, since the overlapping region of the chip ring with the dicing line can be set to be less than 10% of the total region where the chip rings are formed, the contamination of the chips by the flying/scattering of copper at the time of the dicing can be avoided.

3. Appearance Examples of LSI Chips Cut Out from Wafer

In the embodiments of the present invention, chip rings are used as a current supply path at the time of copper plating, and characteristics mainly lie in a device structure on a wafer. Additionally, according to the embodiments of the present invention, characteristics different from those of usual chips appear even in appearances of LSI chips cut out from the wafer, and will be described below.

Figure 16:
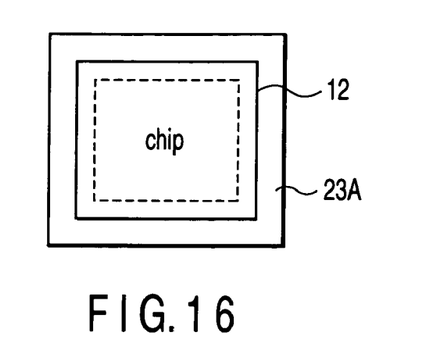
FIG. 16 is a diagram showing an appearance example of an LSI chip according to the embodiment of the present invention.

FIG. 16 shows Appearance Example 1 of the LSI chip according to the embodiment of the present invention.

An LSI chip 23A relates to a case where a device structure according to the first embodiment is adopted. In this example, the chip ring 12 is exposed to the whole edge (side surface) of the LSI chip 23A.

Figure 17:
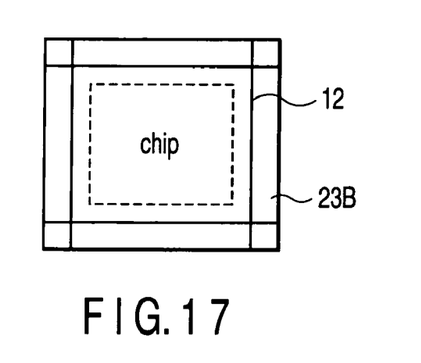
FIG. 17 is a diagram showing an appearance example of the LSI chip according to the embodiment of the present invention.

FIG. 17 shows Appearance Example 2 of the LSI chip according to the embodiment of the present invention.

An LSI chip 23B relates to a case where a device structure according to the second embodiment is adopted. In this example, the chip ring 12 is partially exposed to each corner portion of the side surface of the LSI chip 23B. The chip ring is exposed to two places in one corner portion, and is therefore exposed to eight places in total in the whole LSI chip 23B.

FIGS. 18 to 21 show Appearance Examples 3 to 6 of LSI chips according to the embodiments of the present invention.

LSI chips 23C to 23F relate to a case where a device structure according to the second embodiment is adopted. Therefore, a chip ring 12 is partially exposed to each corner portion of the side surface of the LSI chip in the same manner as in the example of FIG. 17.

In the second embodiment, since the chip rings are laid out in a lattice shape, the chip rings need to be electrically connected to one another, and various methods are considered in a connecting method. That is, when the connecting method is changed, a difference is made even in the appearance of the finally formed chip.

Figure 18:
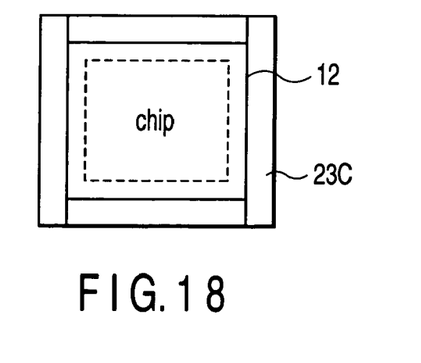
FIG. 18 is a diagram showing an appearance example of the LSI chip according to the embodiment of the present invention.
Figure 19:
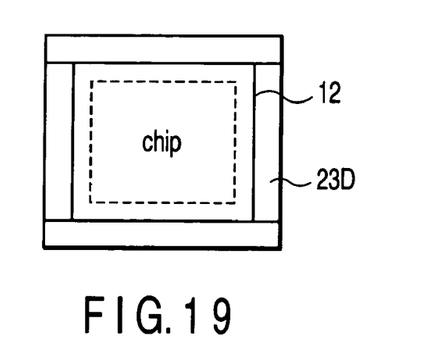
FIG. 19 is a diagram showing an appearance example of the LSI chip according to the embodiment of the present invention.

In the examples of FIGS. 18 and 19, the chip ring 12 is exposed to two side surfaces among four side surfaces of the LSI chip 23C or 23D. Additionally, a portion to which the chip ring 12 is exposed is a corner portion of the LSI chip 23C or 23D.

Figure 20:
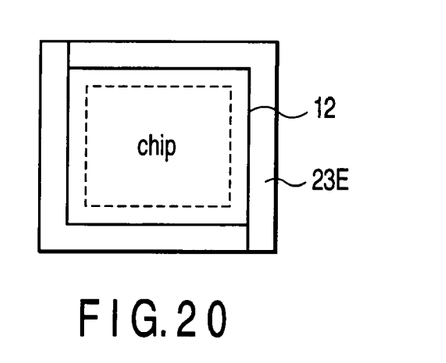
FIG. 20 is a diagram showing an appearance example of the LSI chip according to the embodiment of the present invention.
Figure 21:
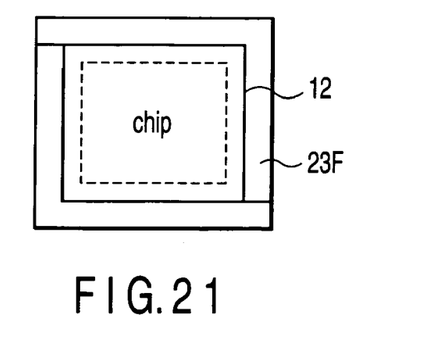
FIG. 21 is a diagram showing an appearance example of the LSI chip according to the embodiment of the present invention.

The examples of FIGS. 20 and 21 indicate that the chip ring 12 does not have to be exposed to all the corner portions of the LSI chip 23C or 23D. In the examples, the chip ring 12 is exposed to two of four corner portions of the LSI chip 23C or 23D.

It is to be noted that in the appearance examples of the LSI chip, the portions to which the chip ring is exposed are not limited to the corner portions of the LSI chip, and may be in any position as long as the ring is partially exposed to the side surface of the LSI chip.

As described above, when the embodiments of the present invention are applied, various configurations are considered in the appearance examples of the LSI chip cut out from the wafer, but a characteristic that the chip ring is partially exposed to the side surface of the LSI chip may apply to any case.

4. Others

In the above-described embodiments, an example in which copper is used as a wiring material has been described, but the embodiments of the present invention may be applied to a case where a wiring is formed by a metal material other than copper.

The embodiments of the present invention can be applied to various LSIs such as a logic LSI, a memory LSI including DRAM and SRAM, and an LSI constituted of a bipolar transistor.

According to the embodiments of the present invention, since the chip ring functions as a current supply path at the time of plating, uniformity of a plating film thickness in a wafer surface can be largely improved regardless of the thickness of a seed layer, without any cause for dust, or without remodeling a plating solution or a plating device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
    a plurality of chip regions in which semiconductor integrated circuits each having a multilayered wiring structure using a metal wiring are formed and which become independent chips; and
    a plurality of chip rings each having the multilayered wiring structure using the metal wiring and surrounding the respective chip regions,
    wherein the plurality of chip rings are electrically connected to one another.

2. The semiconductor device according to claim 1, wherein a region in which the plurality of chip rings overlap with dicing lines is less than 10% of a whole region in which the plurality of chip rings are formed.

3. The semiconductor device according to claim 2, wherein the plurality of chip rings surround the respective chip regions inside the dicing lines.

4. The semiconductor device according to claim 1, wherein the plurality of chip rings completely overlap with dicing lines.

5. The semiconductor device according to claim 1, wherein the plurality of chip rings have a shape which is combined a plurality of squares, as a whole.

6. The semiconductor device according to claim 1, wherein the metal wiring is a copper wiring.

7. An LSI chip having a rectangular shape comprising:
    a chip region in which a semiconductor integrated circuit having a multilayered wiring structure using a metal wiring is formed; and
    a chip ring having the multilayered wiring structure using the metal wiring and surrounding the chip region,
    wherein the chip ring is partially exposed to the side surface of the LSI chip.

8. The LSI chip according to claim 7, wherein the chip ring is partially exposed to all corner portions of the LSI chip.

9. The LSI chip according to claim 7, wherein the semiconductor integrated circuit is a logic circuit.

10. The LSI chip according to claim 7, wherein the semiconductor integrated circuit is a memory circuit.

11. The LSI chip according to claim 7, wherein the semiconductor integrated circuit is a circuit constituted of a bipolar transistor.

12. The LSI chip according to claim 7, wherein the metal wiring is a copper wiring.

* * * * *